Figure 1:
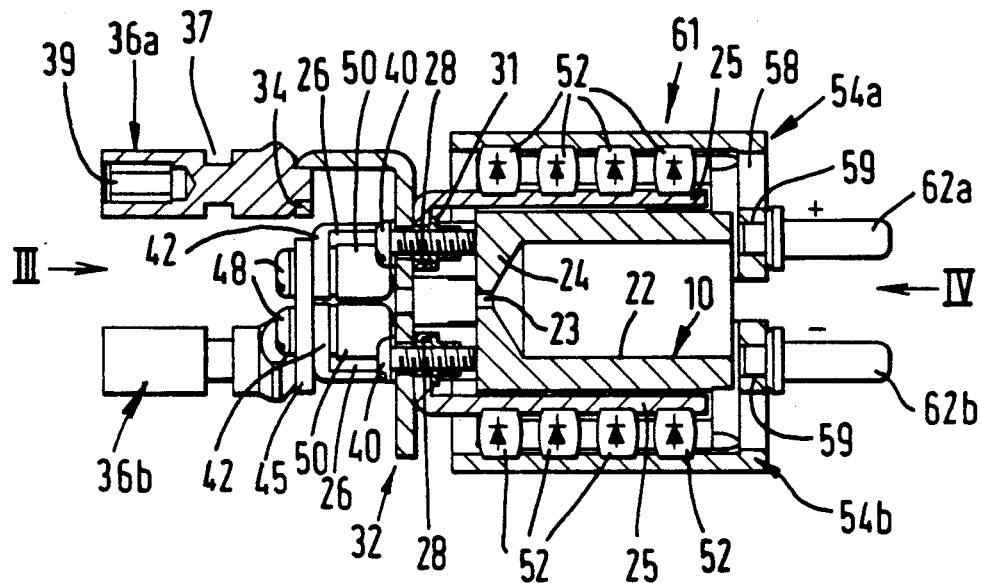

United States Patent
Crickmore et al.

Patent Number: 5,138,210
Date of Patent: Aug. 11, 1992

[54] ROTATABLE RECTIFIER ASSEMBLY

[75] Inventors: Terence L. Crickmore, Hemel Hempstead; Michael E. Smith, Berkhamstead; Andrew D. King, Hemel Hempstead, all of England

[73] Assignee: Lucas Industries plc, England

[21] Appl. No.: 692,149

[22] Filed: Apr. 26, 1991

[30] Foreign Application Priority Data

May 4, 1990 [GB] United Kingdom ............... 9010109

[51] Int. Cl.$^5$ ............................................. H02K 11/00
[52] U.S. Cl. ............................................. 310/68 D
[58] Field of Search ........................ 310/68 D, 68 R; 363/126, 144, 145

[56] References Cited

U.S. PATENT DOCUMENTS

| | | | |
|---|---|---|---|
| 3,412,271 | 11/1968 | Hall | 310/68 D |
| 3,470,405 | 9/1969 | Andersson et al. | 310/68 D |
| 3,739,209 | 6/1973 | Drabik | 310/68 D |
| 4,581,695 | 4/1986 | Hoppe | 310/68 D |
| 4,794,510 | 12/1988 | Wege | 310/68 D |
| 4,959,707 | 9/1990 | Pinchott | 357/76 |
| 5,001,376 | 3/1991 | Iseman | 310/68 D |
| 5,006,741 | 4/1991 | Schott | 310/68 D |
| 5,012,145 | 4/1991 | Frantz et al. | 310/68 D |

FOREIGN PATENT DOCUMENTS

| | | | |
|---|---|---|---|
| 0243366 | 11/1965 | Austria | 310/68 D |
| 1059113 | 6/1959 | Fed. Rep. of Germany | 310/68 D |
| 1130058 | 5/1962 | Fed. Rep. of Germany | 310/68 D |
| 0291288 | 10/1971 | U.S.S.R. | 310/68 D |
| 1334288 | 8/1987 | U.S.S.R. | 310/68 D |

Primary Examiner—Steven L. Stephan
Assistant Examiner—C. La Balle
Attorney, Agent, or Firm—Jones, Askew & Lunsford

[57] ABSTRACT

The assembly includes a plurality of diodes spaced circumferentially about the axis of rotation of the assembly, two spaced apart outer diode mounting members and a plurality of radially inner diode mounting elements. A spacer member is provided which locates the mounting elements in recesses therein. Selected mounting elements are interconnected by linking plates to form a sub-assembly which is received within a housing.

17 Claims, 6 Drawing Sheets

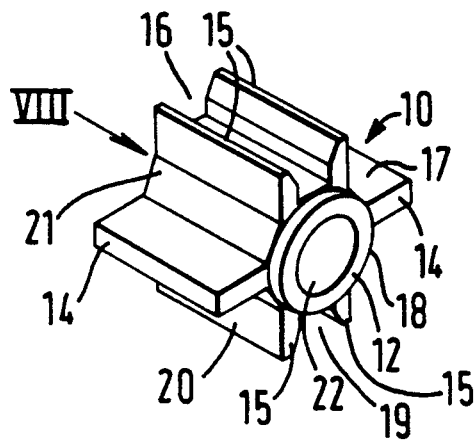
FIG. 7
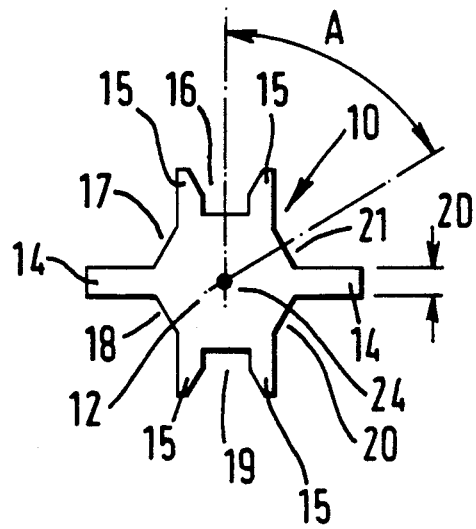
FIG. 8
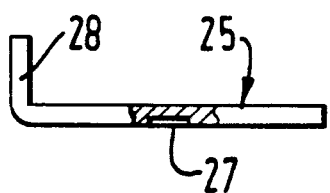
FIG. 9
FIG. 11
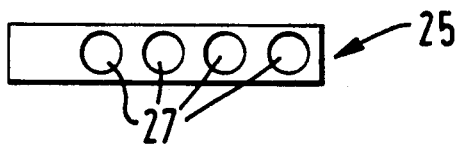
FIG. 10
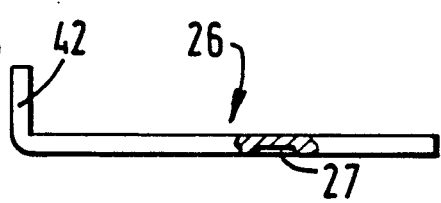
FIG. 12
FIG. 14
FIG. 13

ROTATABLE RECTIFIER ASSEMBLY

The invention relates to a rotatable rectifier assembly and is particularly, but not exclusively, concerned with a rectifier assembly for use in a generating system including first and second generators driven by a common shaft. In such a case, an alternating output of one of the alternators is rectified by the rectifier assembly which rotates with the shaft, the rectifed current being supplied to a rotatable winding of the second alternator. An example of such a rectifier assembly is shown in our GB-A-1595175. Other examples of rotatable rectifier assemblies are shown in U.S. Pat. No. 3,412,271, 4,581,695, EP-A-0068641 and GB-A-2180400.

Where such a rectifier assembly is used in aircraft applications, it is not unusual for the rectifier to undergo rotational speeds in excess of 20,000 RPM which subjects the assembly to considerable centrifugal force. It is, therefore, necessary to provide adequate support for the rectifying diodes whilst at the same time maintaining rotating masses to a minimum.

An object of the present invention is to provide an improved rotatable rectifier assembly.

According to the invention there is provided a rotatable rectifier assembly including a plurality of diodes spaced circumferentially about the axis of rotation of the rectifier assembly, and diode mounting means extending around said diodes and comprising spaced-apart mounting members, a plurality of said diodes being circumferentially spaced apart on one of said mounting members.

The foregoing arrangement provides a convenient mounting for the diodes towards which the diodes will be urged by centrifugal force during rotation.

Preferably, each mounting member supports an equal number of circumferentially spaced diodes. In that way, the diodes can be circumferentially spaced such that the assembly is balanced about the axis of rotation.

Each mounting member may comprise a party-cylindrical member extending around the axis of rotation of the rectifier.

The mounting means is preferably electrically conductive and may be in electrical contact with the diodes. In such a case, the mounting means provides both mounting for the diodes and electrical contact therewith.

The mounting members are preferably spaced apart by a spacer member which may include portions extending between edges of the mounting members. The spacer member may be made from an electrically insulating material and may define circumferentially spaced recesses in which the respective circumferentially spaced diodes are positioned. The spacer member may include a plurality of projections which pass through the respective mounting members. Preferably two adjacent projections pass through each mounting member.

Second mounting means may be provided for the diodes preferably spaced radially inward of the first said mounting means. The second mounting means preferably comprises a plurality of mounting elements.

Where the spacer member defines said circumferentially spaced recesses the mounting elements may extend into said recesses.

Preferably said second mounting means is electrically conductive and each mounting element may then be in electrical contact with a said diode.

Where the first and second mounting means are in electrical contact with the diodes, an unrectified alternating electrical input may be provided to one of the first and second mounting means and a rectified output will then be provided at the other of the first and second mounting means.

Conveniently, the diodes may locate in sockets in the first mounting means and may similarly locate in sockets in the second mounting means.

Preferably, the diodes are attached to the first and/or second mounting means. In such a case, selected mounting elements may be interconnected so as to hold the first mounting means, second mounting means and diodes together as a sub-assembly. The sub-assembly may also include the spacer member.

A diametrically opposed pair of mounting elements may be interconnected by means of a linking member.

Further pairs of mounting elements are preferably interconnected by further linking members which may be arranged one each side of the aforesaid linking members interconnecting the diametrically opposed pair of mounting elements. The further linking members may be shaped to enable them to interconnect non-diametrically opposed mounting elements.

Each linking member is preferably electrically conductive and may carry or be connected to an electrical terminal.

The sub-assembly may be positioned within a housing. Preferably, the housing helps to resist movement of the first and second support means and diodes outwardly as a result of centrifugal force during rotation of the rectifier assembly.

The housing may be formed with axially extending slot means, e.g. diametrically opposed slots, which receives said portions of the spacer member extending between edges of the mounting members.

The sub-assembly is preferably held resiliently within the housing. Resilient load may be applied to the sub-assembly to hold the latter against surface means in the housing. The resilient load may be applied to resilient means such as a waved washer and retaining ring arranged between an end of the subassembly and retention means on the housing.

One of the mounting means may include electrically conductive pins which locate in sockets in a rotatable part of an electrical machine to conduct rectified electric current from the rectifier to the machine.

Preferably, the pins are provided on the first mounting means, e.g., on an end face thereof.

In a preferred embodiment, each diode is one of a set comprising a plurality of diodes spaced apart in the direction of the rotational axis of the rectifier. The axially spaced diodes of each set may be supported by the first support means and, where provided, the second support means.

The sets of diodes are preferably in electrical contact with both the first and second support means.

Figure 2:
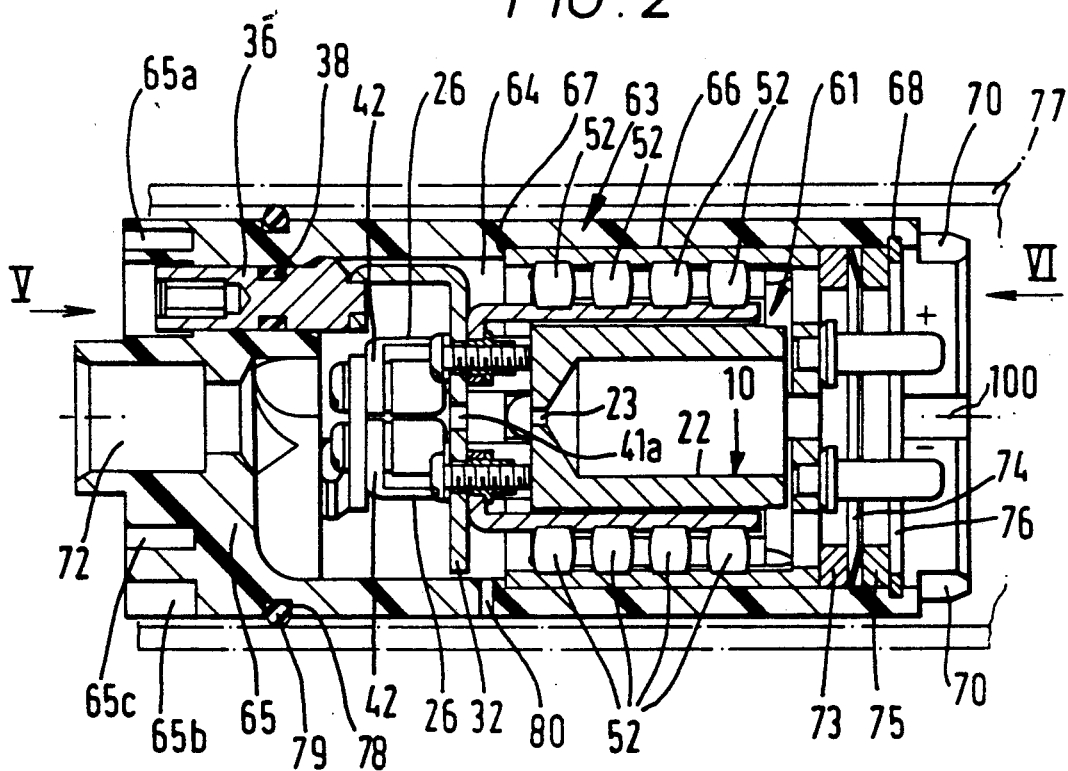
Figure 3:
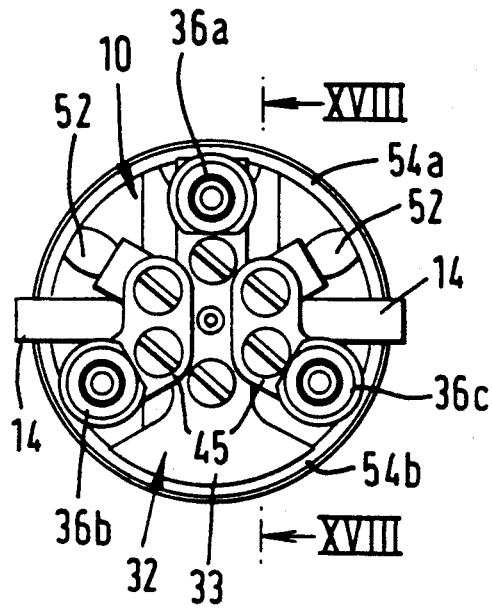
Figure 4:
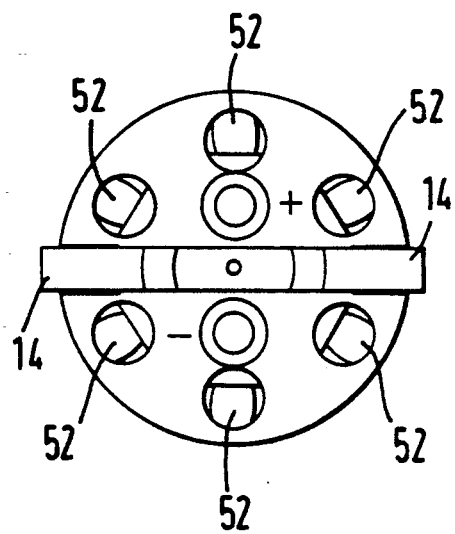
Figure 5:
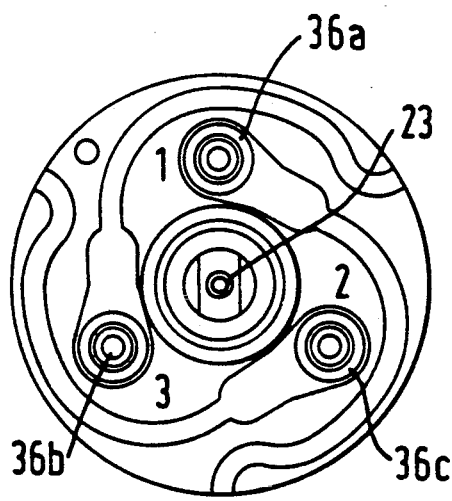
Figure 6:
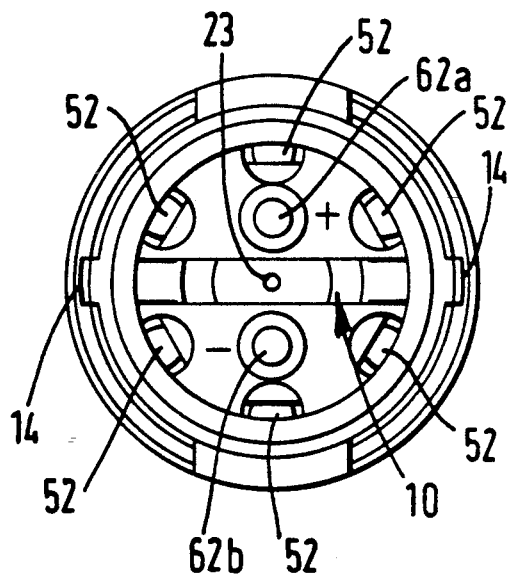
Figure 15:
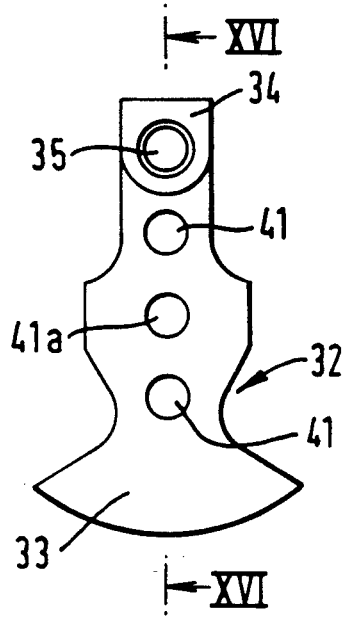

A rectifier assembly in accordance with the invention will now be described by way of example with reference to the accompanying drawings in which:

FIG. 1 is a longitudinal cross-section of a sub-assembly of the rectifier assembly, FIG. 2 is a longitudinal cross-section similar to FIG. 1 showing the completed rectifier assembly, FIGS. 3 and 4 are end views of the sub assembly of FIG. 1 looking in the direction of Arrows III and IV respectively in FIG. 1, FIGS. 5 and 6 are end views of the assembly of FIG. 2 looking in the direction of Arrows V and VI respectively in FIG. 2, FIG. 7 is a perspective view of a spacer element, FIG. 8 is an end view of the spacer element of FIG. 7 looking in the direction of arrow VIII in FIG. 7, FIG. 9 is an elevation of a short connection strip for diodes and shown partly in cross section, FIGS. 10 and 11 are respective under plan and end views of the strip of FIG. 9, FIG. 12 is an elevation of a long connection strip for diodes and shown partly in cross-section, FIGS. 13 and 14 are respective under plan and end views of the strip of FIG. 12, FIG. 15 is an elevation of a linking plate drawn to a larger scale.

Figure 16:
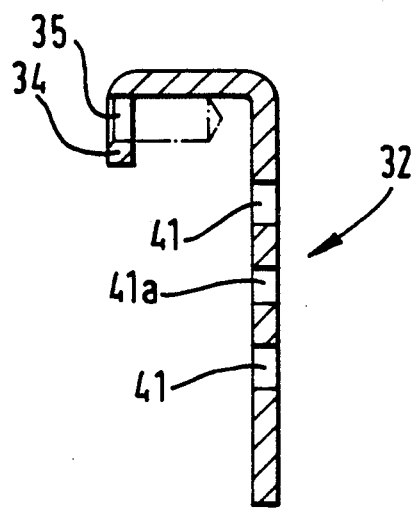
Figure 17:
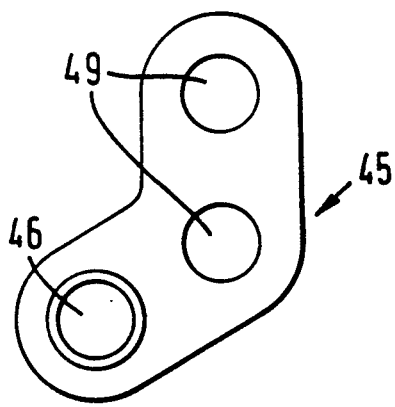
Figure 18:
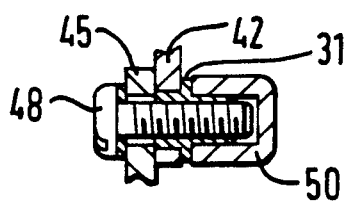
Figure 26:
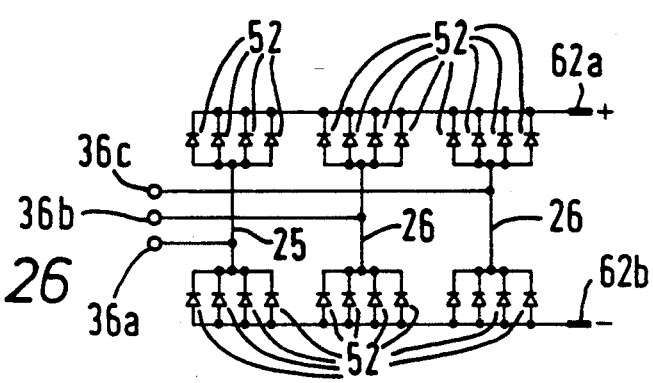
Figure 19:
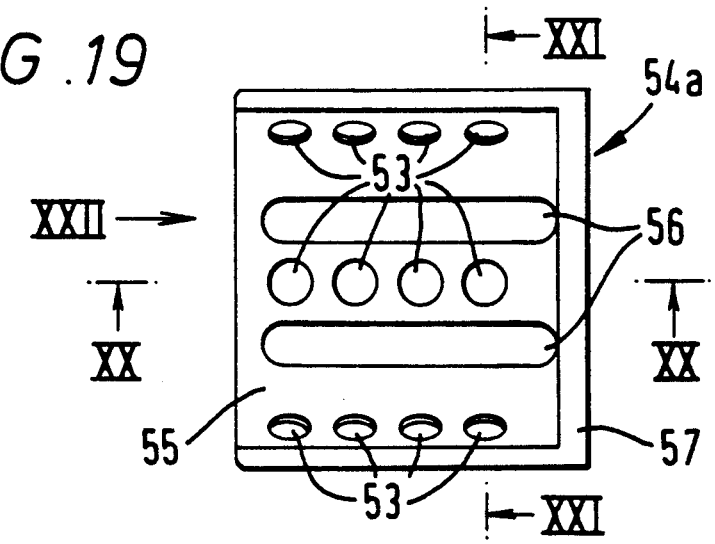
Figure 20:
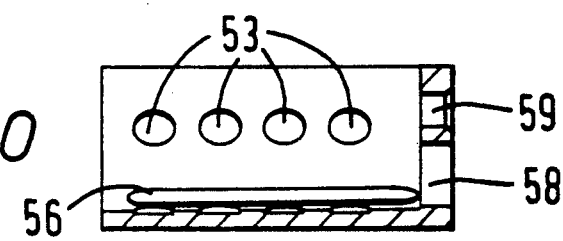
Figure 21:
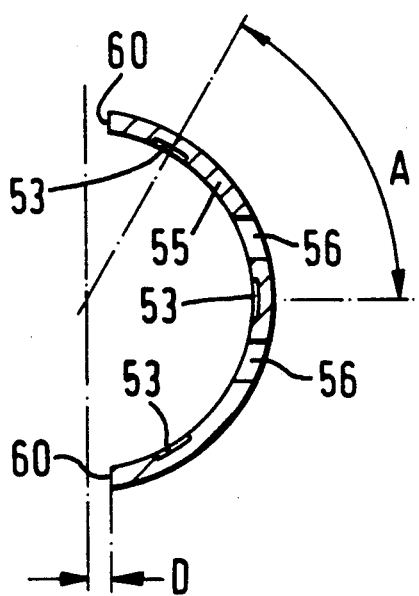
Figure 22:
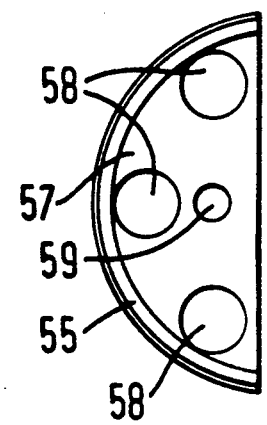
Figure 23:
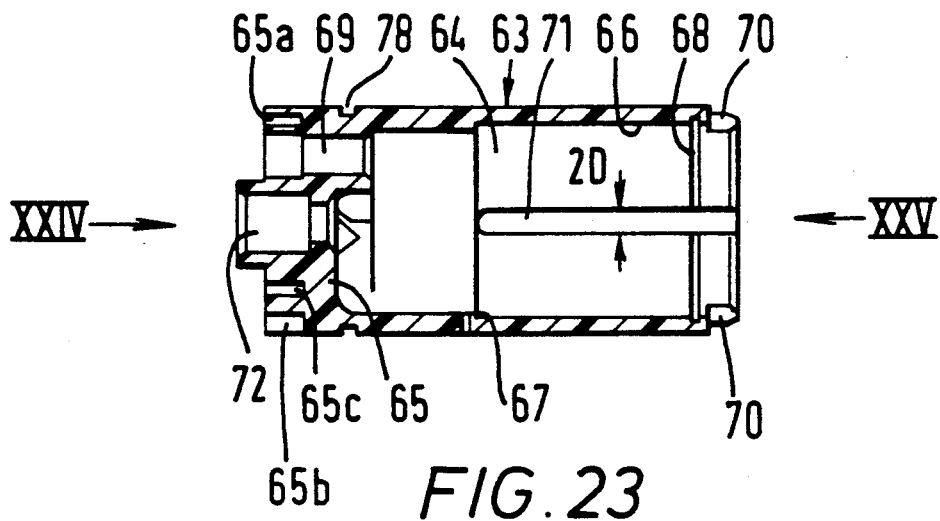
Figure 24:
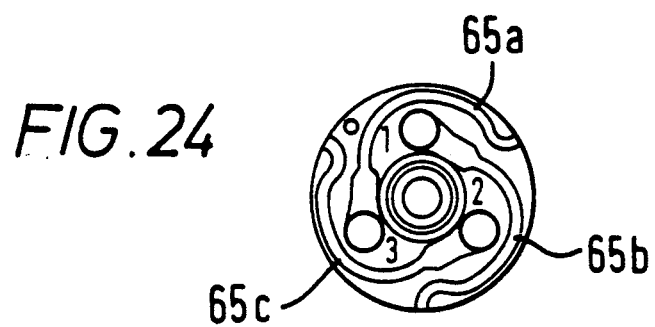
Figure 25:
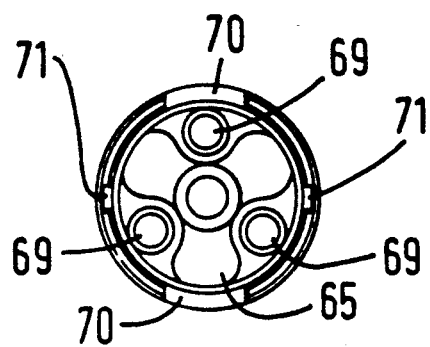

FIG. 16 is a cross-section of the linking plate of FIG. 15 on the line XVI—XVI in FIG. 15, FIG. 17 is an elevation of another linking plate drawn to a larger scale, FIG. 18 is a cross-section drawn to a larger scale through part of linking plate connection to line XVIII—XVIII in FIG. 3, FIG. 19 is an elevation of a shell for supporting some of the diodes, FIG. 20 is a cross-section through the shell of FIG. 19 on line XX—XX in FIG. 19, FIG. 21 is a cross-section through the shell of FIG. 19 on line XXI—XXI in FIG. 19, FIG. 22 is an end view of the shell of FIG. 19 looking in the direction of Arrow XXII in FIG. 19, FIG. 23 is a cross-section drawn to a smaller scale through the housing for receiving the sub-assembly of FIG. 1, FIGS. 24 and 25 are end views of the housing of FIG. 23 looking in the direction of Arrows XXIV and XXV respectively in FIG. 23, and FIG. 26 is a circuit diagram for the rectifier assembly.

With reference to FIGS. 1-8, a spacer block 10 has a body 12 formed with diametrically opposed wings 14 and two pairs of arms 15. Six flat-bottom grooves 16–21 are defined between the arms. The spacer block 10 has an axially extending bore 22 terminating at a reduced diameter aperture 23 in an end wall 24 thereof. The grooves 16–21 locate diode connection strips described below and are spaced apart by angle A (60 degrees).

The diode connection strips (constituting collectively the aforesaid second diode mounting means) comprise two short metal strips 25 (FIGS. 9 to 11) which locate in grooves 16 and 19, and four long strips 26 (FIGS. 12 to 14) which locate in grooves 17, 18, 20 and 21. Each of the short strips 25 is formed with a row of four shallow sockets 27 and is bent over at its left-hand end as shown in the drawings to define a flange 28 formed with a bore 29. A screw threaded hollow fastener 31 (FIG. 1) is press-fitted into bore 29. In the FIG. 1 sub-assembly the flanges 28 extend towards each other and are interconnected by means of a metal linking plate 32 (see FIGS. 15 and 16). The linking plate 32 has a sector shaped portion 33 at one end which provides static balancing of the assembly and is bent to a channel-shape at its opposite end so as to define a terminal flange 34 formed with a bore 35. An electrical terminal 36a is located in the bore 35. The terminal is formed with a peripheral groove 37 for receiving an O-ring 38 (see FIG. 2) and has an axially extending blind bore 39 extending from its left hand end. The linking plate 32 is attached to the fasteners 31 of the short strips 25 by means of screws 40 which pass through apertures 41 in the linking plate 32. A central aperture 41a is formed in the linking plate.

Each long strip (see FIGS. 12 to 14) is of similar construction to the short strips and is formed with four sockets 27 identical to those in the short strips. The long strips 26 extend further out of their spacer block grooves than the short strips but, like the short strips, are formed with bent over flanges 42 each of which is formed with a bore 43 into which a further hollow screw threaded fastener 31 (see FIG. 18) is press fitted. In the sub-assembly, the flanges 42 of the strips 26 in grooves 17, 18 are interconnected by means of an obtuse angled linking plate 45 which has a terminal aperture 46 therein. A terminal 36b is press fitted into aperture 46 of one plate 45 and an identical terminal 36c in the aperture 46 of the other. The linking plate 45 is connected to the flanges 42 by means of screws 48 which pass through apertures 49 in the linking plate 45 and into the fasteners 31. The free end of each screw 48 is covered by an insulating cap 50 (FIG. 18). The remaining two long strips 26 in grooves 20, 21 are arranged in the same way as the opposite pair of long strips in the grooves 17, 18 and are interconnected in the same way by a reversed linking plate 45.

Four barrel-shaped diodes 52 have end contact faces soldered into the sockets 27 of each strip 25, 26 so that the diodes extend radially outwards from the strips. The polarity of each diode 52 is indicated by the conventional diode symbol marked on each diode shown in FIG. 1. The radially outer contact faces of the diodes are located in identical sockets 53 formed in two part cylindrical shells 54a, 54b one of which (54a) is shown in detail in FIGS. 19 to 22. The shells 54a, 54b constitute collectively the aforesaid first diode mounting means. The positive outer faces of diodes 52 are connected to shell 54a and the negative outer faces of the diodes 52 are connected to shell 54b.

Each shell comprises a cylindrical portion 55 formed with three rows of the sockets 53 circumferentially spaced by angle A (60 degrees) and with two elongate slots 56. The shell has an end wall 57 formed with three circumferentially spaced apertures 58 and a central pin-receiving aperture 59. The edges 60 of each shell stop short of a complete half circle by distance D (FIG. 21). The edges 60 of the shell are spaced apart by the wings 14 of the spacer block 10, the wings having a thickness of approximately 2D and the arms 15 extend into slots 56. As shown in FIGS. 1 and 2, the pin-receiving apertures 59 support electrically conductive pins 62a, 62b which are press-fitted or soldered into the apertures 59. One pin 62a will be of positive polarity in use and the other pin 62b negative as shown in FIGS. 1, 2, 4 and 6.

The arrangement shown in FIG. 1 constitutes a sub-assembly 61 which is positioned within a housing 63 shown in detail in FIG. 2 and in FIGS. 23 to 25 to a smaller scale. The housing may be moulded from plastics material or machined (a moulded version being shown) and is formed with a bore generally indicated at 64 which terminates at a left-hand end wall 65. The bore 64 includes a counter bore 66 which terminates at a shoulder 67. The counter bore 66 if formed with a peripheral groove 68. The end wall 65 is formed with three equi-spaced axial bores 69. The right-hand end of the housing is formed with two diametrically opposed slots 70. A central through-bore 72 is formed in the end wall 65 and two diametrically opposed axial grooves 71 of width 2D are formed in the wall of counterbore 66.

The outer end of wall 65 is formed with three spiral-like grooves 65a, 65b, 65c for receiving connecting cables (not shown) associated with terminals 36a, 36b, 36c.

The sub-assembly 61 is introduced into the housing 63 from the right until the left-hand ends of the shells 54a, 54b abut the shoulder 67. The diameter of the counter bore 66 is selected so that the wall of the counter bore engages the cylindrical outer surfaces of the shells 54a, 54b firmily whilst still permitting the sub-assembly to slide into the housing. The wings 14 of the spacer block 10 slide along the slots 71 and align the sub-assembly within the housing so that the terminals 36a, 36b, 36c enter the respective bores 69. The O-rings 38 are placed in the grooves 37 of the terminals prior to assembly so as to sealingly engage the bores 69. Once the sub-assembly 61 has been positioned in the housing 63 in that way, an annular spacer 73 of insulating material is placed against the right-hand end of the shells 54a, 54b, a waved washer 74 is placed in abutment with the spacer 73 and a further spacer 75 is located against the waved washer. The further spacer 75 is then urged to the left to compress the waved washer and permit a retaining ring 76 to be located in the groove 68 thereby retaining the sub-assembly 61 in the housing.

The complete rectifier assembly can be positioned within a hollow shaft 77 of an alternator. The housing 63 has an external groove 78 housing an o-ring 79 which sealingly engages the inner surface of shaft 77. The pins 62 locate within sockets (not shown) provided in a pick-up member (also not shown) in the shaft 77. The slots 70 receive alignment keys (not shown) on the pick-up member. Cables (not shown) from the pick-up member are typically connected to a rotatable direct current winding of a second alternator and output cables (not shown) from a three-phase first alternator are connected by cables to the terminals 36a, 36b, 36c, the latter cables lying in the grooves 65a, 65b, 65c.

In use, electric current from the three-phase first alternator passes to the terminals 36a, 36b, 36c, through the associated long and short strips and through the diodes for rectification. Rectified direct current then passes through the shell 54a to the positive pin 62a, the electric layout being shown diagrammatically in FIG. 26.

The construction steps will normally be as follows:
1. Press-fit fasteners 31 to strips 25, 25 and solder diodes 52 into the sockets 27 of the strips 25, 26.
2. Solder/press-fit terminals 62a, 62b to shells 54a, 54b.
3. Solder/press/fit terminals 36a, 36b to linking plates 32, 45.
4. Solder the shells 54a, 54b onto the diodes with the diodes located in the sockets 53.
5. Fit cap 50 to fastener 31 on strips 26.
6. Insert the spacer block 10 between the two shells with the arms 15 extending through the slots 56.
7. Screw the linking plates 32, 45 to the associated strips 25, 26 to produce a single sub-assembly 61.
8. Fit the O-rings 38 into the grooves 37 of the terminals 36a, 36b, 36c.
9. Locate the sub-assembly 61 in the housing 63.
10. Place the spacer 73, waved washer 74 and spacer 75 in position, compress the waved washer and fit the retaining ring 76 into groove 68 to retain the sub-assembly 61 within the housing.

The rectifier assembly provides a light-weight easily assembled arrangement highly resistant to deformation as a result of high centrifugal forces during rotation about an axis 100. The first and second diode mountings provide extremely positive location and electrical contact for the diodes. Also the diodes are so sandwiched between the first and second mountings that centrifugal loading will apply only a compressive force thereto, which can easily be withstood. Moreover the small and relatively lightweight strips 25, 26, impart only minimal additional centrifugal loading thereby keeping additional centrifugal loading on the diodes to a minimum. The shells 54a, 54b engage the inside of the housing and provide firm support for the sub-assembly under centrifugal forces.

The completed assembly is easy to locate or remove from the main hollow shaft 77 for replacement or testing.

The operation of the rectifier will normally generate a certain amount of heat and it is proposed to cool the rectifier by means of a cooling fluid fed into the hollow shaft 77. The cooling fluid enters from the right so as viewed in FIG. 2 and flows into the center of the rectifier. It then flows outwardly under centrifugal force past the diodes 52. The fluid then moves to the left, is forced by pressure to move inwards and then exits through bore 72. Some of the oil flows out through a radial port 80 in housing 63 and provides a flow of cooling fluid for a rotor winding of the second alternator.

The circumferential and axial positioning of the components of the assembly provides dynamic balancing during rotation of the assembly. The assembly is statically balanced by the sector shaped portion 33.

The terminals 36a, 36b, 36c linking plates 41, 45, strips 25, 26 and shells 54a, 54b are preferably made of copper alloy. The spacer block 10 may be moulded from high temperature engineering plastics material.

The diodes 52 may be of a silicon junction, non-cavity cavity metoxilite bead type machined to length.

We claim:

1. A rotatable rectifier assembly including a plurality of diodes spaced circumferentially about the axis of rotation of the rectifier assembly, outer diode mounting means extending around said diodes and comprising a plurality of spaced-apart mounting members, each mounting member being arranged to support a plurality of said diodes spaced apart in circumferential and axial rows, and inner diode mounting means comprising a plurality of mounting elements each of which is arranged to support a single axial row of said diodes.

2. A rotatable rectifier assembly according to claim 1 in which each mounting member supports an equal number of circumferentially and axially spaced diodes.

3. A rotatable rectifier assembly according to claim 1 in which each mounting member comprises a part-cylindrical member extending around the axis of rotation of the rectifier.

4. A rotatable rectifier assembly according to claim 1 in which the mounting members are electrically conductive and are in electrical contact with the diodes whereby the mounting members provide both mounting for the diodes and electrical contact therewith.

5. A rotatable rectifier assembly according to claim 1 in which the mounting members are spaced apart by a spacer member which includes portions extending between edges of the mounting members, and the spacer member apart the mounting elements.

6. A rotatable rectifier assembly including a plurality of diodes spaced circumferentially about the axis of rotation of the rectifier assembly, diode mounting means extending around said diodes and comprising spaced-apart mounting members, a plurality of said diodes being circumferentially spaced apart on one of said mounting members, the mounting members being spaced apart by a spacer member which includes portions extending between edges of the mounting members and the spacer member defining circumferentially spaced recesses in which the respective circumferentially spaced diodes are positioned.

7. A rotatable rectifier assembly according to claim 6 in which the spacer includes a plurality of projections which pass through the respective mounting members.

8. A rotatable rectifier assembly according to claim 6 in which a second diode mounting means in the form of a plurality of mounting elements is provided, the mounting elements extending into said recesses.

9. A rotatable rectifier assembly according to claim 1 in which each mounting element is in electrical contact with its said single axial row of diodes.

10. A rotatable rectifier assembly according to claim 1 in which the diodes locate in sockets in the mounting members.

11. A rotatable rectifier assembly according to claim 1 in which the diodes locate in sockets in the mounting elements.

12. A rotatable rectifier assembly according to claim 1 in which the diodes are secured between the first and second mounting means and selected mounting elements are interconnected so as to hold the first mounting means, second mounting means and diodes together as a sub-assembly.

13. A rotatable rectifier assembly including a plurality of diodes spaced circumferentially about the axis of rotation of the rectifier assembly, first diode mounting means extending around said diodes and comprising spaced-apart mounting members, a plurality of said diodes being circumferentially spaced apart on one of said mounting members, second diode mounting means in the form of a plurality of mounting elements, the diodes being secured between the first and second mounting means and selected mounting elements being interconnected so as to hold the first mounting means, second mounting means and diodes together as a sub-assembly, and a spacer being used to space apart the mounting members of the first mounting means and forming part of the sub-assembly.

14. A rotatable rectifier assembly including a plurality of diodes spaced circumferentially about the axis of rotation of the rectifier assembly, first diode mounting means extending around said diodes and comprising spaced-apart mounting members, a plurality of said diodes being circumferentially spaced apart on one of said mounting members, second diode mounting means in the form of a plurality of mounting elements, the diodes being secured between the first and second mounting means and selected mounting elements being interconnected so as to hold the first mounting means, second mounting means and diodes together as a sub-assembly, and selected mounting elements being interconnected by a member formed with a section which is arranged to assist static balancing of the rectifier assembly.

15. A rotatable rectifier according to claim 14 in which the member formed with said section interconnects two diametrically opposed mounting elements.

16. A rotatable rectifier assembly according to claim 13 in which the sub-assembly is positioned within a housing arranged to resist movement of the first and second mounting means and diodes outwardly as a result of centrifugal force during rotation of the rectifier assembly.

17. A rotatable rectifier assembly according to claim 16 in which the sub-assembly is held resiliently within the housing.

* * * * *